(12) United States Patent
Funke et al.

(10) Patent No.: US 9,806,034 B1
(45) Date of Patent: Oct. 31, 2017

(54) SEMICONDUCTOR DEVICE WITH PROTECTED SIDEWALLS AND METHODS OF MANUFACTURING THEREOF

(71) Applicant: Nexperia B.V., Eindhoven (NL)

(72) Inventors: Hans-Juergen Funke, Luebeck (DE); Tobias Sprogies, Hamburg (DE); Rolf Brenner, Hamburg (DE); Rüdiger Weber, Pinneberg (DE); Wolfgang Schnitt, Hamburg (DE); Frank Burmeister, Hamburg (DE)

(73) Assignee: Nexperia B.V., Eindhoven (NL)

( * ) Notice: Subject to any disclaimer, the term of this patent is extended or adjusted under 35 U.S.C. 154(b) by 0 days.

(21) Appl. No.: 15/183,940

(22) Filed: Jun. 16, 2016

(51) Int. Cl.
*H01L 21/78* (2006.01)
*H01L 23/00* (2006.01)
*H01L 23/544* (2006.01)

(52) U.S. Cl.
CPC ............ *H01L 23/562* (2013.01); *H01L 21/78* (2013.01); *H01L 23/544* (2013.01); *H01L 2223/5446* (2013.01)

(58) Field of Classification Search
CPC ..... H01L 23/562; H01L 23/544; H01L 21/78; H01L 2223/5446
See application file for complete search history.

(56) References Cited

U.S. PATENT DOCUMENTS

2007/0190688 A1* 8/2007 Youn .................... H01L 21/568
438/108

OTHER PUBLICATIONS

Strothmann, T. et al. "Encapsulated wafer level package technology (eWLCS)", IEEE Electronic Components and Technology Conf., pp. 931-934 (2014).

* cited by examiner

*Primary Examiner* — Selim Ahmed
(74) *Attorney, Agent, or Firm* — Ohlandt, Greeley, Ruggiero & Perle, L.L.P.

(57) ABSTRACT

A method of protecting sidewalls a plurality of semiconductor devices is disclosed. The method includes fabricating the plurality of semiconductor devices on a semiconductor wafer, etching to form a trench grid network on the backside of the semiconductor wafer. The trench grid network demarcate physical boundaries of each of the plurality of semiconductor devices. The method also includes depositing a protective layer on the backside and etching to remove the protective layer from horizontal surfaces and to singulate each of the plurality of semiconductor devices from the semiconductor wafer.

17 Claims, 3 Drawing Sheets

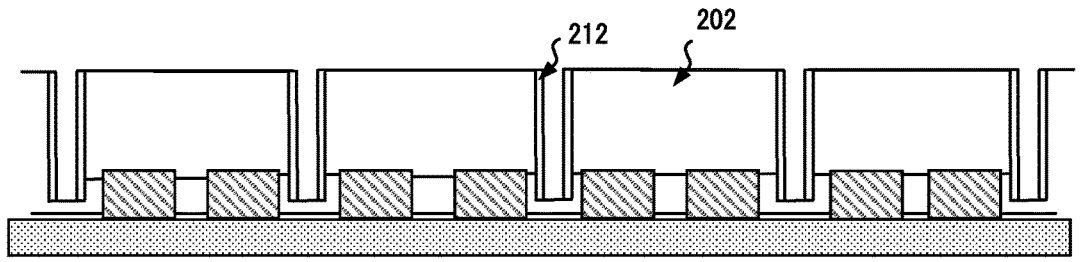
Fig. 7
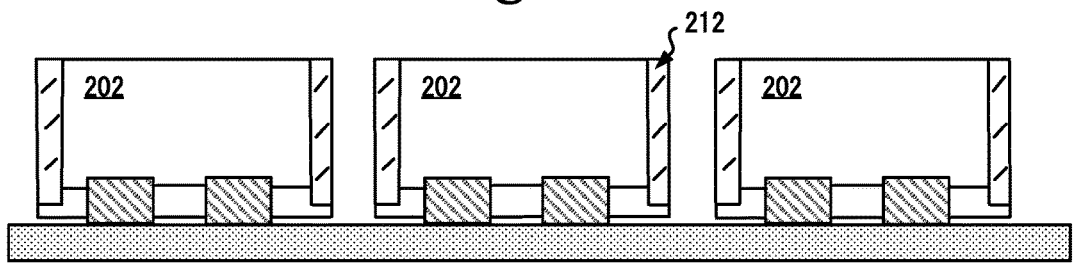
Fig. 8
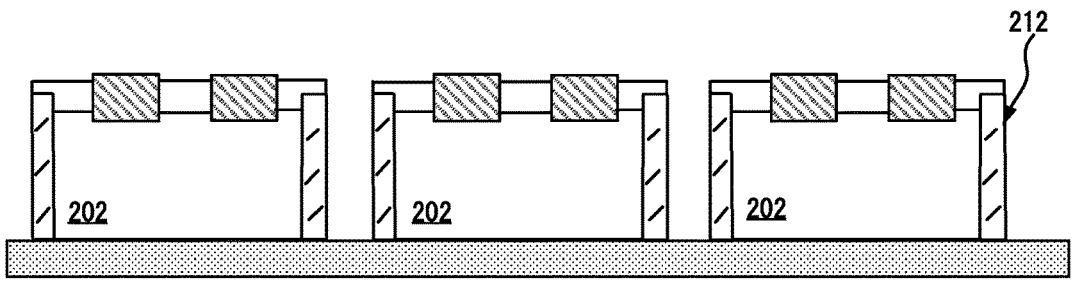
Fig. 9
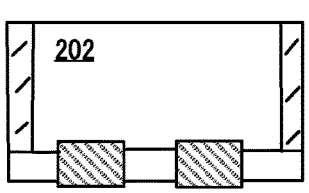 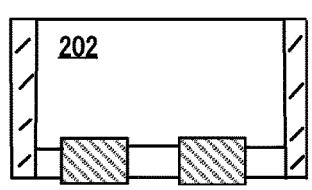 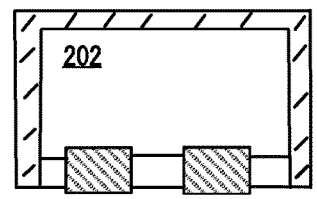
Fig. 10A      Fig. 10B      Fig. 10C

SEMICONDUCTOR DEVICE WITH PROTECTED SIDEWALLS AND METHODS OF MANUFACTURING THEREOF

BACKGROUND

Ever decreasing size of electronic systems demands smaller and thinner electronic components. An electronic component such as an integrated circuit typically uses a small piece of silicon wafer. However, its final size becomes much bigger after packaging and adding contact pins. Solder balls or pads are increasingly being used on the bottom of integrated circuits or even discrete components to replace conventional metal pins and wire bonds. However, to improve system reliability, a semiconductor component (e.g., an integrated circuit) mostly needs to be packaged to provide sidewall protection and preventing cracks.

When device size is small, for example in millimeters or less, unprotected sidewalls may touch solder material and the device may malfunction. FIG. 1 shows a section of a system 100 in which a device 102 is shown as being soldered to solder pads on a printed circuit board (PCB). As depicted, due to a small size, there is a likelihood that solder material 104 may touch sidewalls of the device 102.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a method of protecting sidewalls a plurality of semiconductor devices is disclosed. The method includes (a) fabricating the plurality of semiconductor devices on a semiconductor wafer, (b) forming a plurality of contact pads on each of the plurality of semiconductor devices, (c) forming an isolation layer to cover a surface of the semiconductor wafer such that the plurality of contact pads are covered by the isolation layer, (d) placing the semiconductor wafer on a carrier such that a backside of the semiconductor wafer is facing up and a front side is facing down and non-permanently affixed to the surface of the carrier, (e) etching to form a trench grid network on the backside of the semiconductor wafer. The trench grid network demarcate physical boundaries of each of the plurality of semiconductor devices. The method further includes (f) depositing a protective layer on the backside and (g) etching to remove the protective layer from horizontal surfaces and to singulate each of the plurality of semiconductor devices from the semiconductor wafer.

In some embodiments, the carrier includes a sticky foil. In other embodiments, he carrier includes a buffer wafer. In some embodiments, the forming of the isolation layer includes etching the isolation layer to expose a surface of the plurality of contact pads.

In some embodiments, the protective layer is deposited in gaseous form. The protective layer is made of Parylene or similar type of material as conformal coating. In some embodiments, steps (a) to (g) are performed in sequentially in the listed order.

In another embodiment, a semiconductor device manufactured using an operation on a backside of a wafer is disclosed. The operation includes (a) fabricating the plurality of semiconductor devices on a semiconductor wafer, (b) forming a plurality of contact pads on each of the plurality of semiconductor devices, (c) forming an isolation layer to cover a surface of the semiconductor wafer such that the plurality of contact pads are covered by the isolation layer, (d) placing the semiconductor wafer on a carrier such that a backside of the semiconductor wafer is facing up and a front side is facing down and non-permanently affixed to the surface of the carrier, (e) etching to form a trench grid network on the backside of the semiconductor wafer. The trench grid network demarcate physical boundaries of each of the plurality of semiconductor devices. The method further includes (f) depositing a protective layer on the backside and (g) etching to remove the protective layer from horizontal surfaces and to singulate each of the plurality of semiconductor devices from the semiconductor wafer In some embodiments, the carrier includes a sticky foil. In other embodiments, he carrier includes a buffer wafer. In some embodiments, the forming of the isolation layer includes etching the isolation layer to expose a surface of the plurality of contact pads.

In some embodiments, by a dividing trench and the protective coating covers the dividing trench with the protective compound.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

FIG. 7 shows the semiconductor wafer after the protective layer is removed from horizontal surfaces in accordance with one or more embodiments of the present disclosure;

FIG. 8 shows the semiconductor wafer after further etching in the trenches to separate individual devices in accordance with one of more embodiments of the present disclosure;

FIG. 9 shows the semiconductor wafer being processed with front side up, after further etching in the trenches to separate individual devices in accordance with one of more embodiments of the present disclosure; and FIGS. 10A-10C shows various embodiments of devices in accordance with one of more embodiments of the present disclosure.

Figure 1:
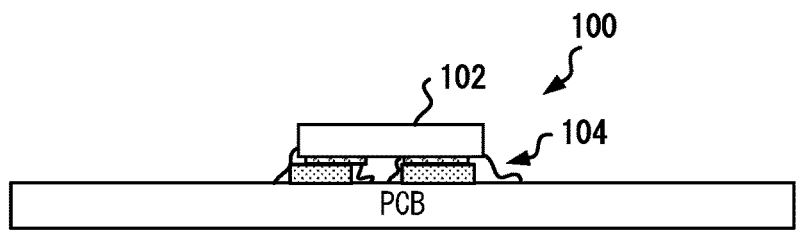
FIG. 1 depicts a section of a device soldered to pads on a printed circuit board (PCB)

Note that figures are not drawn to scale. Intermediate steps between figure transitions have been omitted so as not to obfuscate the disclosure. Those intermediate steps (e.g., applying photoresist) are known to a person skilled in the art.

DETAILED DESCRIPTION

Systems being built today are much smaller than before when factoring features and computing power they offer. More and more components are being packed into these small products year after year. The number of components in per unit area on a semiconductor wafer have also been going up year after year. It is well known that a plurality of same devices is formed on a semiconductor wafer and then each of these devices are cut from the wafer and packaged into a plastic like cover to protect the delicate device inside. Pins are added prior to packaging to provide a way for an external circuit to connect with the device inside the package. The packaging and pins increase the overall size of the device substantially. Technologies have been developed to replace pins with solder balls on the bottom of a device. However, having these solder balls attached to the bottom of a device creates issue because normal packaging technologies can no longer be used. Further, if the device is used on a system board without packaged, the issues relating to sidewall isolation/protection and preventing cracks become prominent. Further, since the device size may be very small it is desirable that the packaging process must be completed prior to cutting these devices from the wafer because it may be expensive to develop special machines that can handle all sizes of devices individually without damaging them during packaging steps while providing high yield. It will be apparent from the following description that the methods described herein can be accomplished using the same technologies and processes that are used for device fabrication. Further, devices on the entire wafer can be packaged simultaneously, thus providing high yield and reducing overall cost.

Conventionally, as described in "Encapsulated Wafer Level Pack Technology (eWLCS)" by Tom Strothmann, IEEE 2014, the wafer is diced prior to the wafer level packaging process. The dice are then reconstituted into a new wafer form with adequate distance between the die to allow for a thin layer of protective coating to remain after final singulation. This process is prone to defects as it is difficult to handle small dies and to ensure uniform distance between dies during the reconstruction of the new wafer. This prior art process also require process steps (e.g., reconstruction of the new wafer from a plurality of dies) that are not used in standard semiconductor fabrication process. Further, since the protective coating is applied from the active side of the wafer, the prior art process requires protecting solder pads prior to the application of the protective coating. The methods described herein do not require singulation of dies prior to the application of a thin protective coating and since the process of applying the protective coating is performed from the backside of the wafer, the protection of solder pads is not needed.

Figure 2:
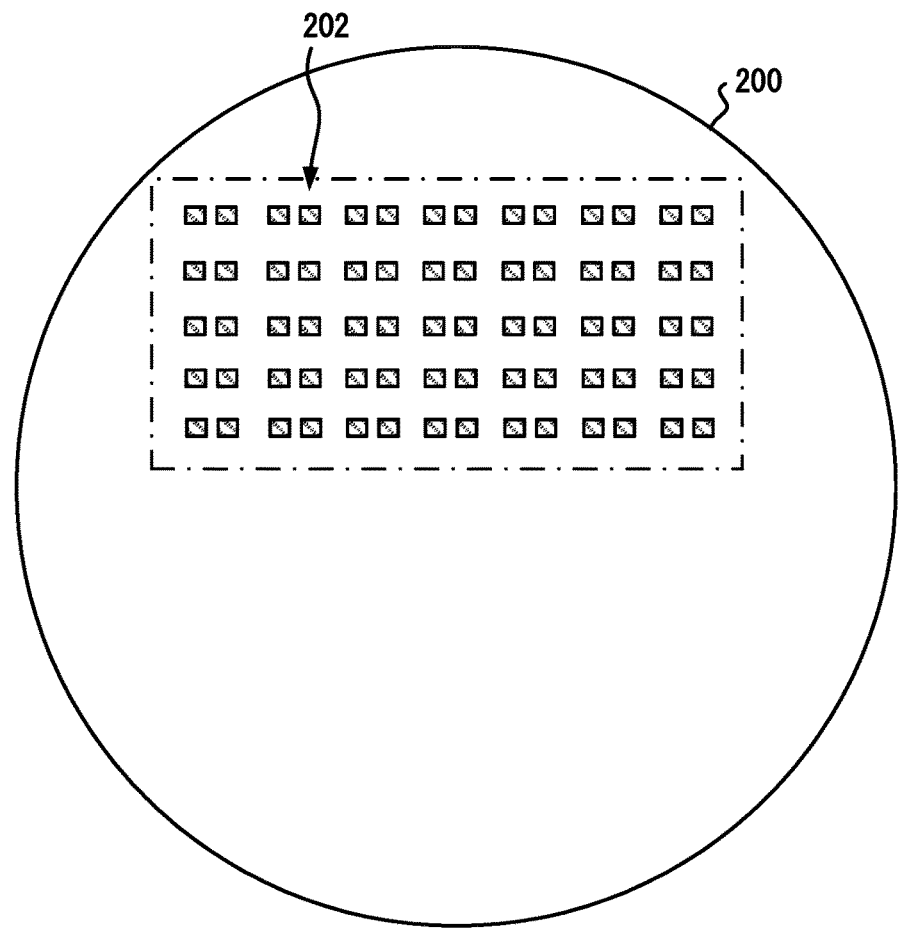
FIG. 2 illustrates a plurality of contact pads of devices fabricated in a semiconductor wafer in accordance with one or more embodiments of the present disclosure.
Figure 3:
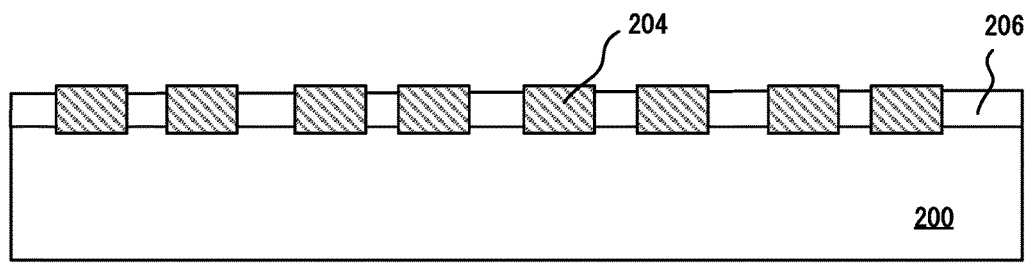
FIG. 3 shows the isolation layer, with exposed contact in accordance with one of more embodiments of the present disclosure.

FIGS. 2 and 3 illustrate a plurality of contact pads of devices 202 fabricated in a semiconductor wafer 200. A section of the semiconductor wafer 200 is shown to illustrate that a plurality of identical devices 202 may be fabricated simultaneously on a semiconductor wafer 200. In these examples, each device 202 is shown to have two contact pads 204. However, in practice the device 202 may have different number of contact pads depending on the type of device. For example, if the device 202 is a diode, two contact pads are necessary. However, if the device 202 is a complex circuit having a plurality of components, the number of contact pads in each device may vary. An isolation layer 206 is formed over the surface of the semiconductor wafer 200. The isolation layer 206 may be made of a polyimide or a similar polymer that offers similar electrical isolation characteristics and strength. In some embodiments, silicon oxide may be used.

FIG. 3 shows the semiconductor wafer 200 after a portion of isolation layer 206 has been etched to expose surfaces of contact pads 204. It should be noted that well known process methods are not being described in detail so as not to obscure the present disclosure.

Figure 4:
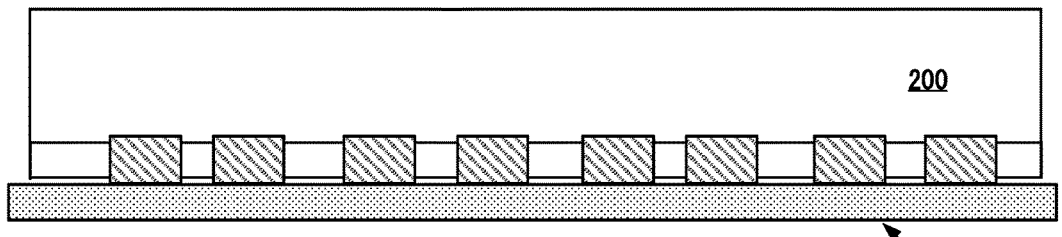
FIG. 4 depicts the semiconductor wafer placed on a carrier in accordance with one of more embodiments of the present disclosure.

FIG. 4 shows the semiconductor wafer 200 securely placed on a carrier 208. The carrier 208 may consist of a stack of materials, for example, a sticky foil and a buffer wafer. The wafer 200 is placed active side down on the carrier 208 for further processing.

Figure 5:
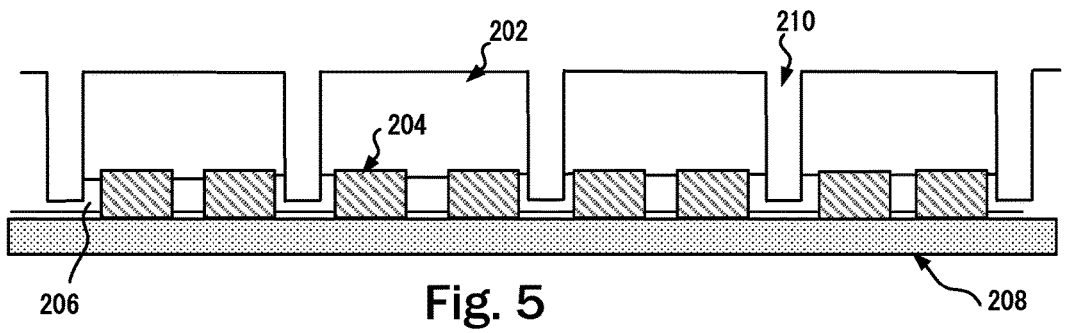
FIG. 5 depicts trenches formed in the backside of the wafer in accordance with one of more embodiments of the present disclosure.

FIG. 5 depicts the semiconductor wafer 200 having trenches formed through the etching process from the backside (opposite side from the side where contact pads 204 are formed) of the semiconductor wafer 200. The width of each trench 210 may depend on the device type. In some applications, the width may be approximately 15-50 microns. The trenches 210 are in a grid pattern so as to demarcate boundaries of each device 202. The depth of the trench 210 exceeds the thickness of the semiconductor wafer 200 and less that the thickness of the semiconductor wafer 200 plus the thickness of the isolation layer 206 (remaining after etching as descripted in FIG. 5).

Figure 6:
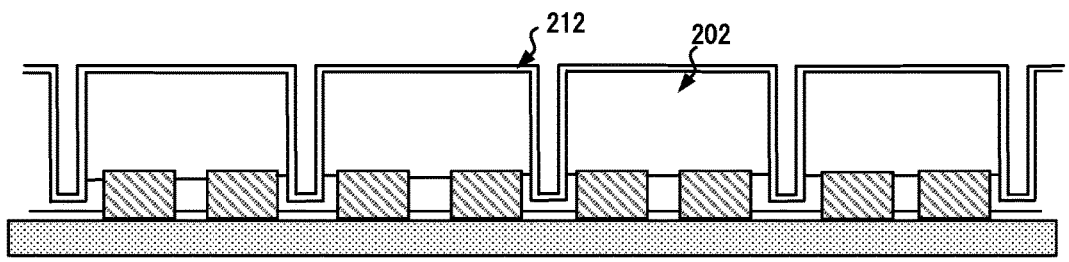
FIG. 6 depicts a protective coating on the backside of the semiconductor wafer in accordance with one of more embodiments of the present disclosure.

FIG. 6 depicts a protective conformal coating over all exposed surfaces on the backside of the semiconductor wafer 200. In one embodiment, Parylene is used as for the protective layer. Parylene provides a good electrical isolation, conformal step coverage and a strong bond to other materials. In other embodiments, materials that exhibits similar electrical isolation and bonding properties as Parylene may be used. It should be noted that since Parylene provides a strong adhesive bond, there is a need for the isolation layer 206 to prevent a direct contact between the Parylene and the carrier 208.

Parylene coatings are applied at ambient temperatures with specialized vacuum deposition equipment. Parylene polymer deposition takes place at the molecular level, where films essentially 'grow' a molecule at a time. A solid, granular raw material, called dimer, is heated under vacuum and vaporized into a dimeric gas. The gas is then pyrolized to cleave the dimer to its monomeric form. In the room temperature deposition chamber, the monomer gas deposits on all surfaces as a thin, transparent polymer film. Because Parylene is applied as a gas, the coating effortlessly penetrates crevices and tight areas on multi-layer components, providing complete and uniform encapsulation. Optimal thickness of the polymer coatings is determined based on the application and the coating properties desired. While Parylene coatings can range in thickness from hundreds of angstroms to several mils, a typical thickness is in the microns range (e.g., 1 to 10 microns).

FIG. 7 shows the semiconductor wafer 200 after the protective layer 212 is removed from horizontal surfaces through the etching process (e.g., plasma etching or chemical etching). Since the etching rate on horizontal surfaces is greater than the etching rate on vertical surfaces, the etching process is controlled to run for a selected period of time so that Parylene is removed from the horizontal surfaces (such as back of the device 202 and the bottom of the trench 210) but stays in form a thin layer on the vertical surfaces (e.g., sidewalls). It should be noted that if the Parylene is not removed from the back of the device 202, a contact with tape that carries the device 202 for production and assembly may cause pick-up problems from the carrier 208 and may cause electrostatic forces so that the device 202 may stick to a cover tape during the assembly of systems that use the device 202.

FIG. 8 shows the semiconductor wafer after further etching in the trenches 210 to singulate individual devices 202 from the semiconductor wafer 200. In some embodiments, the processed described in FIG. 7 and FIG. 8 may be performed in one step using a blanket anisotropic etch to remove Parylene from the back of the semiconductor wafer 200 as well as the isolation layer 206 to make the trench 210 exposing the surface of the carrier 208 at the bottom of the trench 210. As shown, the protective layer 212 is remaining on the sidewalls. If the device 202 replaces the device 102 in FIG. 1, the overflowing solder material 104 will not cause any undesirable electrical contact with other parts of the device 202, other than the contact pads.

FIG. 9 shows the semiconductor wafer 200 being processed through an alternative embodiment in which the wafer is placed on the carrier 208 contacts 204 up (frontside up). The processing described in above figures can be used in the same way. In this embodiment, no protective coating 212 is applied to the backside (facing the carrier 208). A mechanical grinding process may be used to remove the carrier 208 after applying the protective coating 212.

FIG. 10A shows the device 202 in another embodiment. In this embodiment, the etching process described in FIG. 5 is performed such that the isolation layer 206 is not etched in the well 210. In yet another embodiment, the isolation layer 206 is either completely or partially completed etched thus producing the device 202 as shown in FIG. 10B. FIG. 10C shows that in some embodiments, the protective layer 212 may be left intact on the topside, as shown.

Not that in some embodiments, putting the wafer 200 top side down on the carrier 208, as described in FIG. 4, the wafer 200 may be placed on the carrier 208 with contacts 204 up and the wells 210 may be formed by etching at the perimeters of devices 202. The etching is performed such that individual devices 202 are separated from each other. The coating 212 is then applied ever the entire wafer 200. In some embodiments, the wafer 200 may be grinded from the backside to remove the carrier 208.

It should be noted that Parylene is used in the above description as example only in that in some embodiments, other materials with similar mechanical and adhesive properties may be used instead of Parylene. For example, PTFE (polytetrafluoroethylene) or may be used instead of Parylene.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A method of protecting sidewalls of a plurality of semiconductor devices, the method comprising:
   (a) fabricating the plurality of semiconductor devices on a semiconductor wafer;
   (b) forming a plurality of contact pads on each of the plurality of semiconductor devices;
   (c) forming an isolation layer to cover a surface of the semiconductor wafer;
   (d) placing the semiconductor wafer on a carrier such that a backside of the semiconductor wafer is facing up and a front side is facing down and non-permanently affixed to the surface of the carrier
   (e) etching to form a trench grid network on the backside of the semiconductor wafer, wherein the trench grid network demarcates physical boundaries of each of the plurality of semiconductor devices;
   (f) depositing a protective layer on the backside; and
   (g) etching to remove the protective layer from horizontal surfaces and to singulate each of the plurality of semiconductor devices from the semiconductor wafer.

2. The method of claim 1, wherein the carrier includes a sticky foil.

3. The method of claim 1, wherein the carrier includes a buffer wafer.

4. The method of claim 1, wherein the protective layer is deposited in gaseous form.

5. The method of claim 1, the protective layer is made of Parylene or polytetrafluoroethylene.

6. The method of claim 1, wherein steps (a) to (g) are performed sequentially in the listed order.

7. A semiconductor device manufactured using an operation on a backside of a wafer, the operation comprising:
fabricating the plurality of semiconductor devices on a semiconductor wafer;
placing the semiconductor wafer on a carrier such that a backside of the semiconductor wafer is facing up and a front side is facing down and non-permanently affixed to the surface of the carrier
etching to form a trench grid network on the backside of the semiconductor wafer, wherein the trench grid network demarcates physical boundaries of each of the plurality of semiconductor devices;
depositing a protective layer on the backside; and
etching to remove the protective layer from horizontal surfaces and to singulate each of the plurality of semiconductor devices from the semiconductor wafer.

8. The semiconductor device of claim 7, wherein the carrier includes a sticky foil.

9. The semiconductor device of claim 7, wherein the carrier includes a buffer wafer.

10. The semiconductor device of claim 7, wherein the operation further comprises forming an isolation layer and etching parts of the isolation layer to expose a surface of a plurality of contact pads.

11. The semiconductor device of claim 7, wherein the protective layer is deposited in gaseous form.

12. The semiconductor device of claim 7, the protective layer is made of Parylene or polytetrafluoroethylene.

13. A method of protecting sidewalls of a plurality of semiconductor devices, the method comprising:
(a) fabricating the plurality of semiconductor devices on a semiconductor wafer;
(b) forming a plurality of contact pads on each of the plurality of semiconductor devices;
(c) forming an isolation layer to cover a surface of the semiconductor wafer;
(d) placing the semiconductor wafer on a carrier such that a front side of the semiconductor wafer is facing up and a back side is facing down and non-permanently affixed to the surface of the carrier
(e) etching to form a trench grid network on the semiconductor wafer, wherein the trench grid network demarcates physical boundaries of each of the plurality of semiconductor devices;
(f) depositing a protective layer on the semiconductor wafer; and
(g) etching to remove the protective layer from horizontal surfaces and to singulate each of the plurality of semiconductor devices from the semiconductor wafer.

14. The method of claim 13, wherein the carrier includes a sticky foil.

15. The method of claim 13, wherein the carrier includes a buffer wafer.

16. The method of claim 13, wherein the protective layer is deposited in gaseous form.

17. The method of claim 13, the protective layer is made of Parylene or polytetrafluoroethylene.

* * * * *